United States Patent
Hou et al.

(10) Patent No.: US 6,567,275 B1
(45) Date of Patent: May 20, 2003

(54) MODULAR STACK DEVICE

(75) Inventors: Ming-Chu Hou, Taipei (TW); Chih-Hsiang Lee, Taoyuan (TW); Ching-Yuan Wang, Taipei (TW)

(73) Assignee: Quanta Computer, Inc., Tao Yuan Shien (TW)

( * ) Notice: Subject to any disclaimer, the term of this patent is extended or adjusted under 35 U.S.C. 154(b) by 0 days.

(21) Appl. No.: 10/164,271

(22) Filed: Jun. 5, 2002

(51) Int. Cl.[7] .................... H05K 7/00; H05K 7/02; H05K 7/04
(52) U.S. Cl. .............. 361/807; 740/801; 740/735; 740/728; 740/747
(58) Field of Search .............. 361/801, 802, 361/726, 728, 731, 732, 740, 741, 747, 756, 759, 735, 742, 758, 770, 785, 790, 796, 788, 807–811, 679; 211/41.17, 26.2; 312/223.1, 223.2; 292/1, 261, 299, 300, 305, 306; 24/1, 288

(56) References Cited

U.S. PATENT DOCUMENTS 6,327,160 B1 * 12/2001 Liao .......................... 361/809

* cited by examiner

Primary Examiner—David Martin
Assistant Examiner—Phuong T. Vu

(57) ABSTRACT

A modular stack device with at least one stack module is disclosed. The stack module comprises a U-shaped member, a mounting pad, a mounting stud, and a positioning component. The U-shaped member is for holding a casing and has an upper wall, a bottom wall, and a side wall. The mounting pad is disposed on the exterior of the bottom wall and a mounting stud is disposed on the exterior of the upper wall, wherein the mounting stud is opposite to the mounting pad. The positioning component is formed on the side wall and used for positioning the U-shaped member. Several stack modules of the modular stack device can stack a number of casings, by inserting the mounting studs to the mounting pads, respectively.

8 Claims, 4 Drawing Sheets

MODULAR STACK DEVICE

BACKGROUND OF THE INVENTION

1. Field of the Invention

The invention relates in general to a stack device, and more particularly to a modular stack device.

2. Description of the Related Art

In order to maximize floor space, many companies stack a number of servers high in a rack and make the server platform as scalable as possible. Since thin servers can be stacked densely in the same rack, 1U (1.75 inches in height) servers have become quite popular, whether for the application-specific or general-purpose design. Conventionally, servers are put into the rack-mountable chassis to be stacked up. However, an additional stand or pedestal is usually required to steady the server when the server is removed from the chassis and placed on the table.

SUMMARY OF THE INVENTION

It is therefore an object of the invention to provide a modular stack device capable of stacking multiple servers in a small space. The modular design of the disclosed device not only makes the server platform scalable, but also provides a flexible architecture allowing for separability. Therefore, it ensures stability for the server even if only one server is placed on the table, without the need of an additional stand or pedestal.

The invention achieves the above-identified objects by providing a modular stack device. The modular stack device has at least one stack module and the stack module comprises a U-shaped member, a mounting pad, a mounting stud, and a positioning component. The U-shaped member is for holding a casing and has an upper wall, a bottom wall, and a side wall. The mounting pad is disposed on the exterior of the bottom wall, and a mounting stud is disposed on the exterior of the upper wall, wherein the mounting stud is opposite to the mounting pad. The positioning component is formed on the side wall and used for positioning the U-shaped member.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
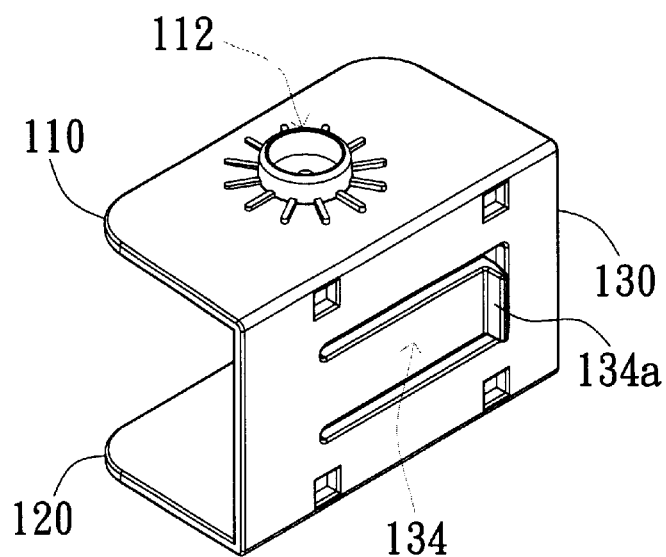
FIG. 1A is an elevated view showing the front, left side of a stack module.
Figure 1B:
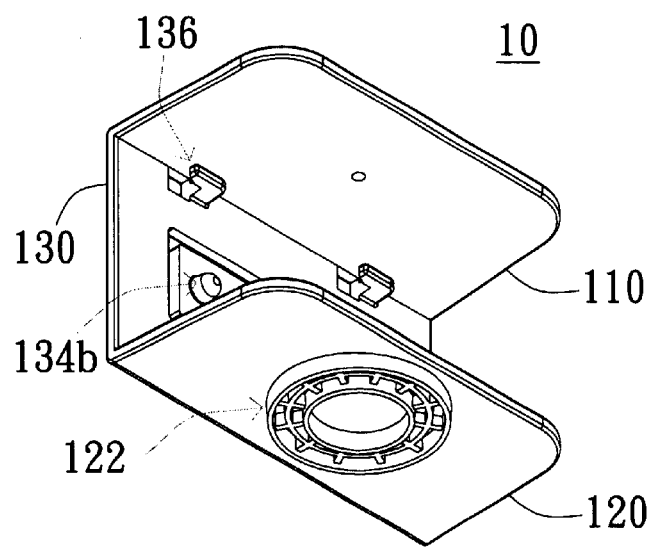
FIG. 1B is an elevated view showing the rear, right side of a stack module.

The modular stack device according to the invention has at least one stack module. Referring to FIGS. 1A and 1B, an elevated view of the front, left side of a stack module is shown in FIG. 1A, and an elevated view of the rear, right side of a stack module is shown in FIG. 1B. The stack module 10 includes a U-shaped member, a mounting pad, a mounting stud, and a positioning component. The main body of the stack module 10 is U-shaped and has an upper wall 110, a bottom wall 120, and a side wall 130. The mounting stud 112 is disposed on the exterior of the upper wall 110, as shown in FIG. 1A, while the mounting pad 122 is disposed on the exterior of the bottom wall 120, as shown in FIG. 1B. The mounting stud 112 is opposite to the mounting pad 122. The positioning component 134 formed on the side wall 130 is for positioning the U-shaped member. The positioning component 134 includes a buckle 134b and a handle 134a. The buckle 134b is disposed on the interior of the side wall 130 and the handle 134a is disposed on the exterior of the side wall 130. Additionally, there are several fasteners 136 on the interior of the side wall 130.

Figure 2:
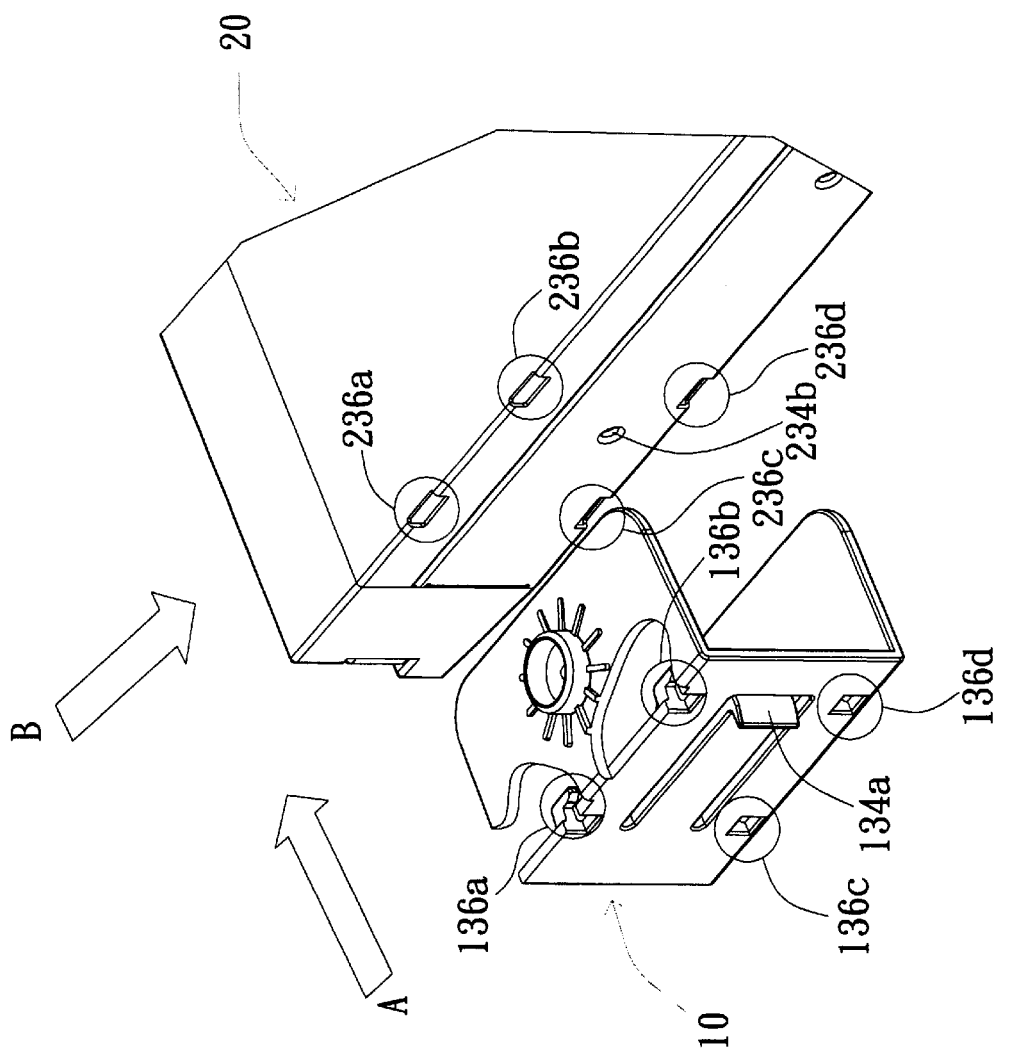
FIG. 2 is a partial cross-sectional view of a stack module before holding a server.

Referring to FIG. 2, a partial cross-sectional view shows a stack module. As shown in FIG. 2, the stack module 10 is first moved toward the casing 20 along the direction A and then fixed to the casing 20 by the displacement along the direction B. The U-shaped design of the U-shaped member is for holding the casing 20 of the server. The fasteners 136a, 136b, 136c, and 136d are L-shaped clips and protrude from the side wall 130. When the stack module 10 contacts the casing 20, the U-shaped member holds the casing 20 and the fasteners 136a, 136b, 136c, and 136d are inserted into the openings 236a, 236b, 236c, and 236d on the casing 20 respectively. After the displacement along the direction B, the fasteners 136a, 136b, 136c, and 136d clip the casing 20 and the buckle 134b (as shown in FIG. 1B) can be removably attached to the positioning point 234b on the casing 20 and thus, lock the U-shaped member in a locked position. The handle 134a is used for releasing the buckle 134b to unlock the U-shaped member from the locked position.

Figure 3:
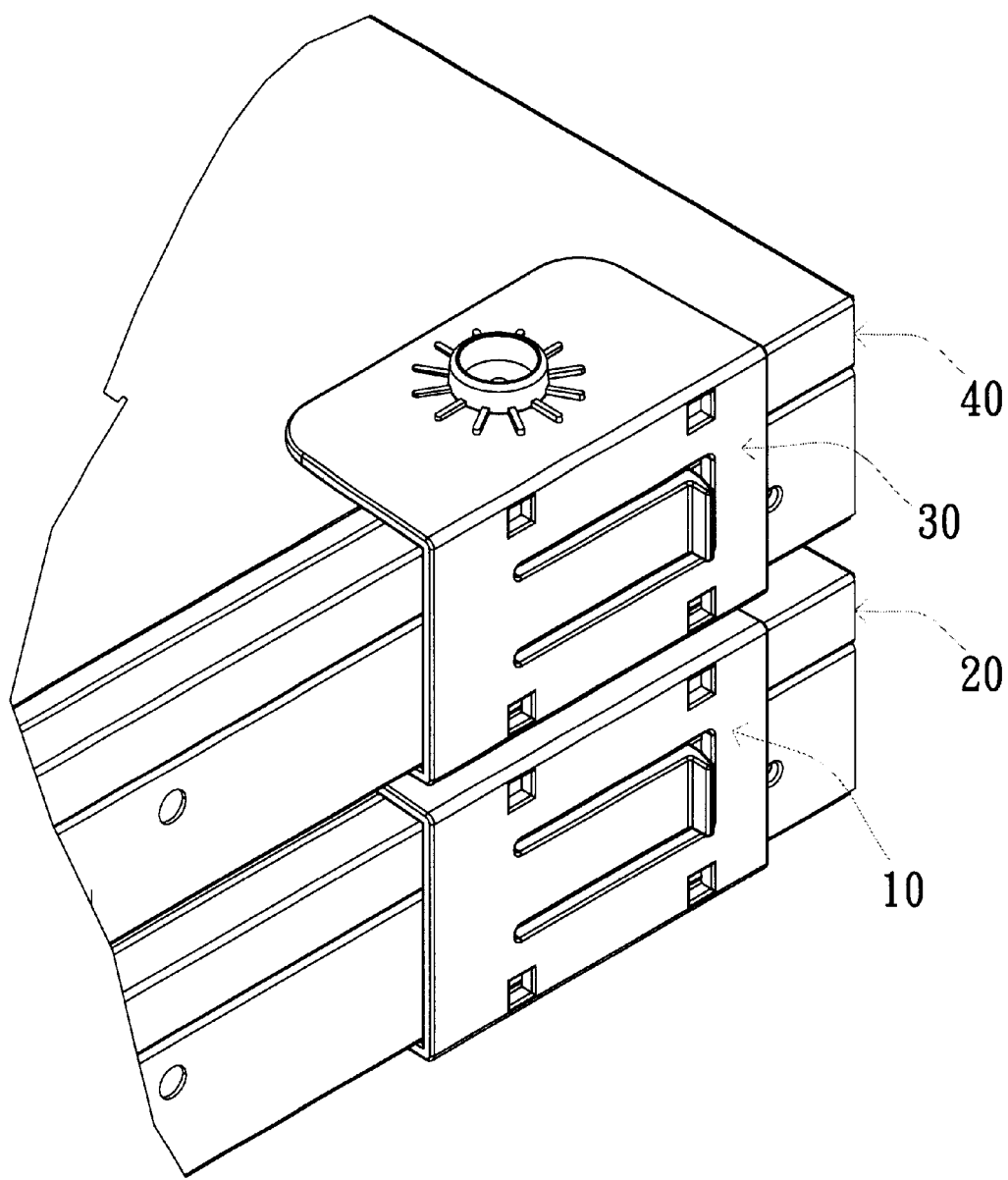
FIG. 3 is a perspective view showing a modular stack device according to the first preferred embodiment of the invention.

Referring to FIG. 3, a perspective view shows a modular stack device according to the first preferred embodiment of the invention. The modular stack device can have a number of the stack modules for stacking several casings by inserting the mounting studs 112 (FIG. 1A) to the mounting pads 122 (FIG. 1B), respectively. As shown in FIG. 3, the first stack module 10 is positioned on the first casing 20 and the second stack module 30 is positioned on the second casing 40. In addition, the second stack module 30 is mounted on the first stack module 10 by inserting the mounting stud of the first stack module 10 to the mounting pad of the second stack module 30 so that the bottom wall of second stack module 30 is adjacent to the upper wall of the first stack module 10. Hence, the modular stack device makes the server platforms scalable, and multiple servers can be stacked up into a small space.

Figure 4:
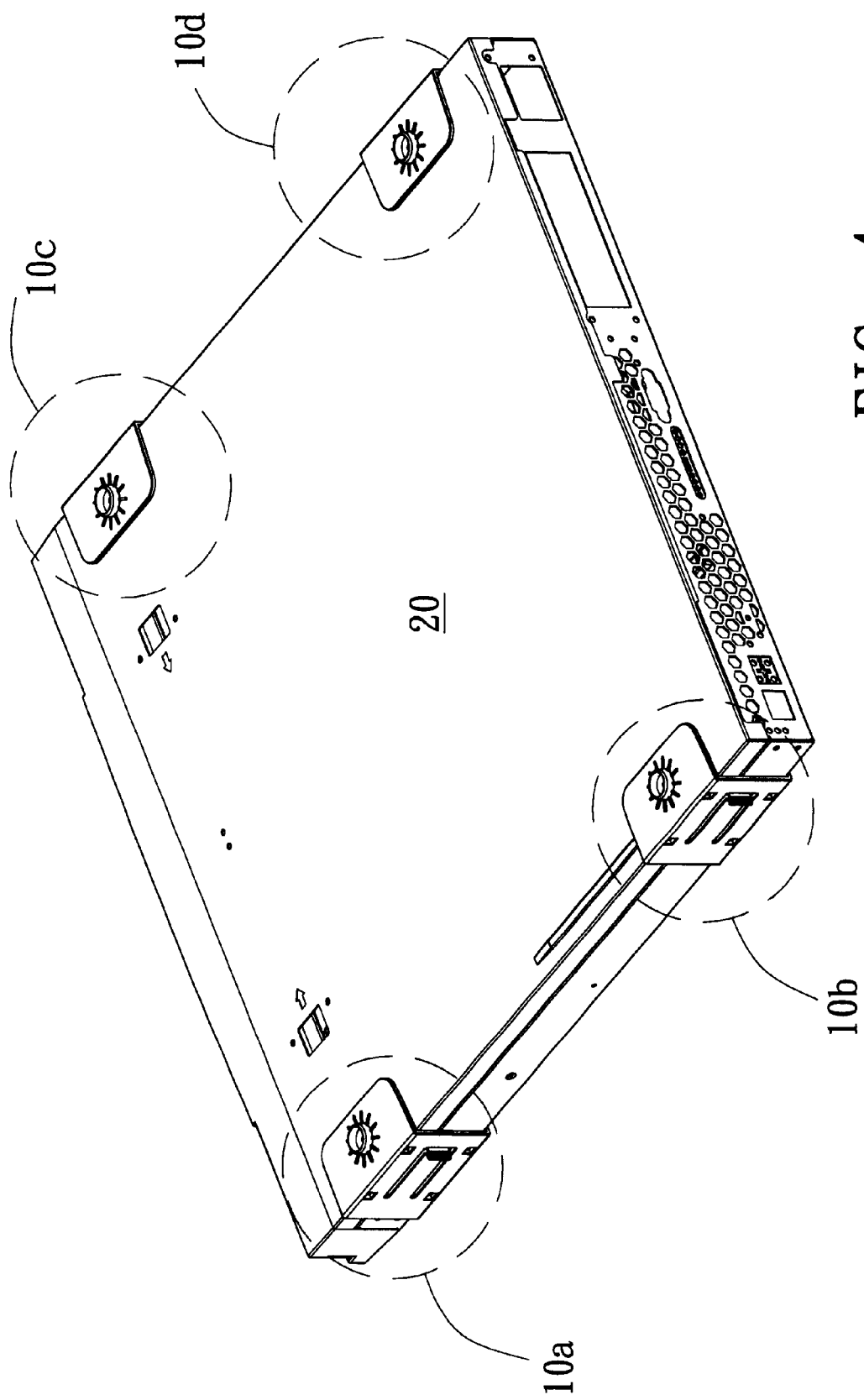
FIG. 4 is a perspective view showing a modular stack device according to the second preferred embodiment of the invention.

Referring to FIG. 4, a perspective view shows a modular stack device according to the second preferred embodiment of the invention. The modular design of the device is a flexible architecture allowing for separability. As shown in FIG. 4, the modular stack device has four stack modules 10a, 10b, 10c and 10d positioned around the casing 20. The modular stack device ensures stability for the casing 20 even if only one server is placed on the table. It is cost-effective since there is no need to require an additional stand or pedestal before placing the casing on the table.

The modular stack device according to the invention has the following advantages:

1. The modular design makes the server platform scalable and allows several servers to be stacked so as to save space.

2. The modular design of the device is a flexible architecture allowing for separability and therefore provides a wide selection of stack levels. The modular stack device is cost-effective, and also quick and easy to stack and install.

3. It ensures stability for the server even if only one server is placed on the table, without the need of an additional stand or pedestal.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A modular stack device having at least one stack module, the stack module comprising:
   a casing;
   a U-shaped member having an upper wall, a bottom wall, and a side wall, the upper wall parallel and corresponding to the bottom wall, the side wall perpendicular to the upper wall and the bottom wall;
   a mounting pad disposed on the exterior face of the bottom wall of the U-shaped member and a mounting stud disposed on the exterior face of the upper wall of the U-shaped member, wherein the mounting stud is opposite to the mounting pad; and
   a positioning component formed on the U-shaped member.

2. The device according to claim 1, wherein the positioning component is formed on the side wall of the U-shaped member.

3. The device according to claim 1, wherein the modular stack device further comprises a fastener protruding from the side wall so that the fastener is inserted into an opening on the casing for clipping the casing.

4. The device according to claim 3, wherein the fastener is a L-shaped clip.

5. A modular stack device having at least one stack module for holding a casing, the stack module comprising:
   a U-shaped member;
   a mounting pad disposed on the exterior of the U-shaped member and a mounting stud disposed on the exterior of the U-shaped member, wherein the mounting stud is opposite to the mounting pad; and
   a positioning component formed on the U-shaped member, the positioning component comprising:
      a buckle disposed on the interior of the side wall, for locking the U-shaped member in a locked position; and
      a handle disposed on the exterior of the side wall, for releasing the buckle to unlock the U-shaped member from the locked position.

6. A modular stack device having at least one stack module, the stack module comprising:
   a casing;
   a U-shaped member;
   a mounting pad disposed on the exterior of the U-shaped member and a mounting stud disposed on the exterior of the U-shaped member, wherein the mounting stud is opposite to the mounting pad; and
   a positioning component formed on the U-shaped member;
   wherein the modular stack device has a plurality of the stack modules for stacking a plurality of the casings by inserting the mounting studs of one stack module into the mounting pads of another stack module respectively.

7. A modular stack device having at least one stack module, the stack module comprising:
   a casing, wherein the casing is a 1U server casing;
   a U-shaped member;
   a mounting pad disposed on the exterior of the U-shaped member and a mounting stud disposed on the exterior of the U-shaped member, wherein the mounting stud is opposite to the mounting pad; and
   a positioning component formed on the U-shaped member.

8. A modular stack device, for stacking a first casing and a second casing, the device comprising:
   a first stack module, comprising:
      a first U-shaped member having a first upper wall, a first bottom wall and a first side wall, for holding the first casing;
      a first mounting pad disposed on the exterior of the first bottom wall and a first mounting stud disposed on the exterior of the first upper wall, wherein the first mounting stud is opposite to the first mounting pad; and
      a first positioning component formed on the first side wall, for positioning the first U-shaped member; and
   a second stack module, comprising:
      a second U-shaped member having a second upper wall, a second bottom wall and a second side wall, for holding the second casing;
      a second mounting pad disposed on the exterior of the second bottom wall and a second mounting stud disposed on the exterior of the second upper wall, wherein the second mounting stud is opposite to the second mounting pad; and
      a second positioning component formed on the second side wall, for positioning the second U-shaped member;
   wherein the second stack module is mounted on the first stack module by inserting the first mounting stud to the second mounting pad so that the second bottom wall is adjacent to the first upper wall.

* * * * *